United States Patent [19]
Thomas

[11] Patent Number: 6,043,693
[45] Date of Patent: Mar. 28, 2000

[54] MULTIPLEXED SYNCHRONIZATION CIRCUITS FOR SWITCHING FREQUENCY SYNTHESIZED SIGNALS

[75] Inventor: John C. Thomas, Sunnyvale, Calif.

[73] Assignee: 3DFx Interactive, Incorporated, San Jose, Calif.

[21] Appl. No.: 09/088,646

[22] Filed: Jun. 1, 1998

[51] Int. Cl.[7] ........................................................ H03L 7/00
[52] U.S. Cl. ................................ 327/154; 327/44; 327/99
[58] Field of Search ..................................... 327/141, 154, 327/415, 172, 175, 176, 44, 99, 407

[56] References Cited

U.S. PATENT DOCUMENTS 5,635,857  6/1997  Flora ............................................ 326/39
5,767,720  6/1998  Osera et al. ................................. 327/295

Primary Examiner—Toan Tran
Assistant Examiner—Qua Tra
Attorney, Agent, or Firm—Fenwick & West LLP

[57] ABSTRACT

Multiplexers are used to generate synchronized slave clocks from a common master clock. A first multiplexer and a second multiplexer generate a first slave clock and a second slave clock, respectively, from the common master clock. A third multiplexer and a fourth multiplexer are configured as a divide-by-n circuit for providing a third slave clock that is a divided version of the second slave clock. A fifth multiplexer provides a matching delay to preserve the synchronization between the first slave clock and the other slave clocks. A sixth multiplexer is used to select between the second slave clock and the third slave clock in response to a select signal. A flip-flop may be used to provide the select signal and to guard against false selection of slave clocks.

12 Claims, 3 Drawing Sheets

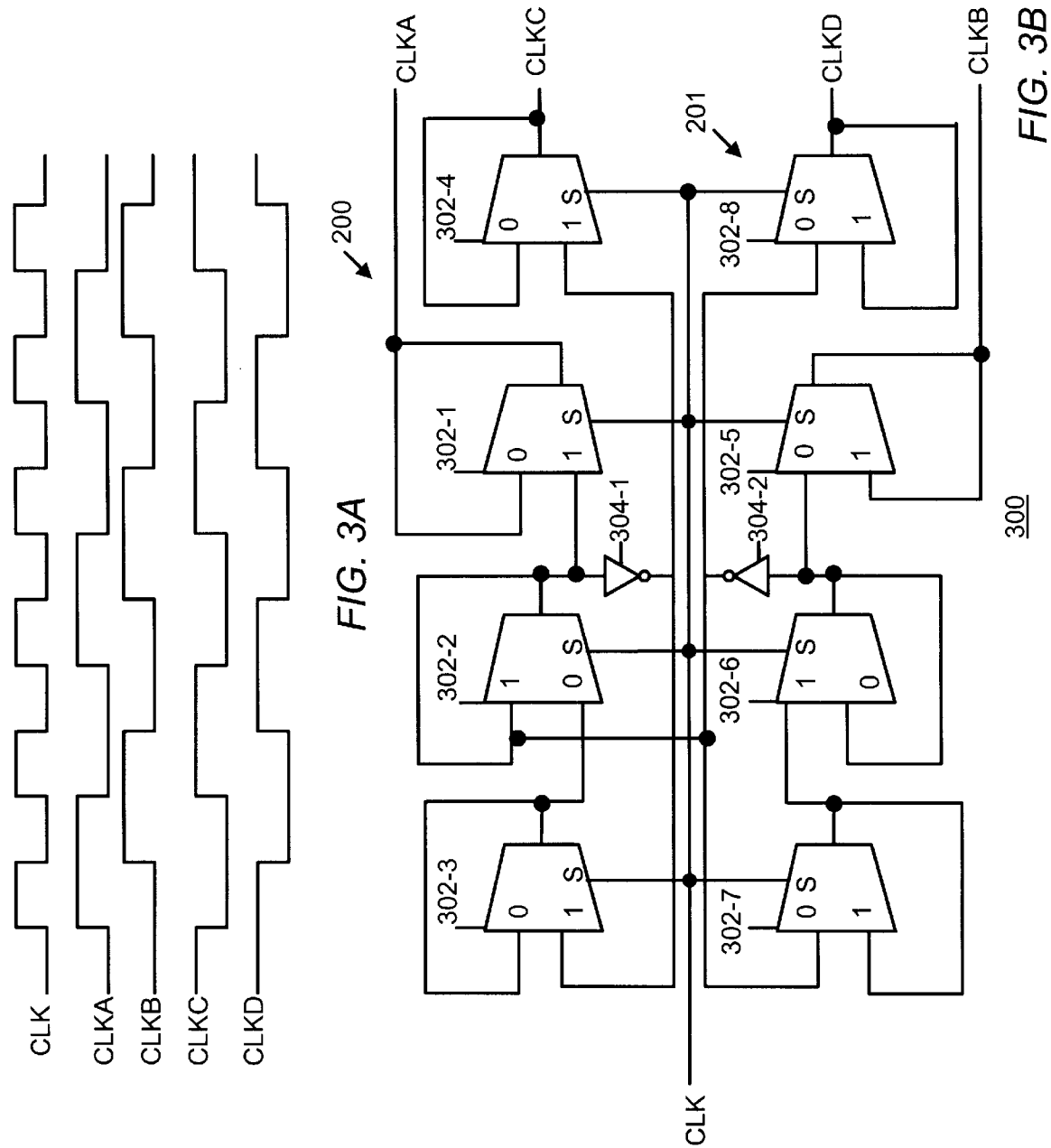

6,043,693

MULTIPLEXED SYNCHRONIZATION CIRCUITS FOR SWITCHING FREQUENCY SYNTHESIZED SIGNALS

FIELD OF THE INVENTION

This invention relates to the design of integrated circuits, and more particularly, to multiplexed synchronization circuits for switching between frequency synthesized signals.

BACKGROUND OF THE INVENTION

It is often necessary in integrated circuit (IC) design to generate frequency synthesized signals. For example, a copy of a master clock may be divided to provide timing and control signals for internal IC functions that operate at different frequencies. The master clock copy typically is divided by a conventional divide-by-n circuit having a plurality of flip-flops. The divide-by-n circuit provides internal IC functions with a clock having a frequency equal to 1/n the frequency of the master clock.

A synchronization problem, however, may arise when switching between the master clock copy and a divided master clock copy. The propagation delay added to the divided master clock copy by, for example, the flip-flops in the divide-by-n circuit, may spoil the synchronization between the master clock copy and the divided master clock copy. Moreover, if a multiplexer is used to select between the master clock copy and the divided master clock copy, additional propagation delay could be added to these clocks which may exacerbate the synchronization problem.

The prior art addresses the synchronization problem by providing a second clock source that operates at twice the frequency of the master clock to derive synchronized clocks. For example, some prior art may generate a synchronized, divided clock by dividing the second clock source by two and four, respectively. Unfortunately, the need to select between a divided and a non-divided copy of a master clock while maintaining synchronization between such clocks is not addressed by such prior art. Moreover, for applications that push the limits of semiconductor technology, it may be impossible to provide a second clock source that operates at twice the frequency of the master clock. Other prior art uses a phase-locked loop (PLL) to synchronize frequency synthesized clocks. Using a PLL, however, may prove too costly for certain applications.

Accordingly, there is a need for multiplexed synchronization circuits for switching between frequency synthesized signals without losing synchronization between such signals.

SUMMARY OF THE INVENTION

The present invention is directed to multiplexed synchronization circuits for switching frequency synthesized signals.

A plurality of selection circuits are used to generate synchronized slave signals from a common source signal. A first selection circuit and a second selection circuit generate from the source signal a first slave signal and a second slave signal, respectively. A third selection circuit and a fourth selection circuit are configured as a divide-by-n circuit for generating a third slave signal that is a divided version of the second slave signal. A fifth selection circuit provides a matching delay to preserve the synchronization between the first slave signal and the other slave signals. A sixth selection circuit is used to select between the second slave signal and the third slave signal in response to a select signal. A glitch prevention circuit may be used to provide the select signal and to guard against false selection of slave signals by the sixth selection circuit.

The present invention is also directed to a method of synchronizing signals. The method includes a step of generating a first slave signal and a second slave signal from a common source signal. The first slave signal is synchronized with the second slave signal. A next step includes generating a third slave signal from the source signal that is a synchronized, divided copy of the second slave signal. Another step includes switching between the second slave signal and the third slave signal in response to a select signal.

The present invention is further directed to multiplexed synchronization circuits for emulating, for example, the output signals of a flip-flop circuit. Such circuits are used as building blocks for a quad phase circuit having synchronized output signals that are 0°, 90°, 180°, and 270° out of phase with a common source signal.

The multiplexed synchronization circuits and methods described above switch frequency synthesized signals without losing synchronization between such signals, and without resorting to, for example, a second signal source operating at twice the frequency of the source signal. By not using a second source signal (e.g., PLL), chip area consumption is reduced.

These and other features, aspects, and advantages of the present invention will become better understood with regard to the following description, appended claims, and accompanying drawings.

BRIEF DESCRIPTION OF THE DRAWINGS

FIG. 3A is a timing diagram illustrating output clocks of one embodiment of a quad phase generation circuit in accordance with the present invention.

FIG. 3B is a circuit diagram of one embodiment of a quad phase generation circuit in accordance with the present invention.

DETAILED DESCRIPTION OF THE INVENTION

Figure 1:
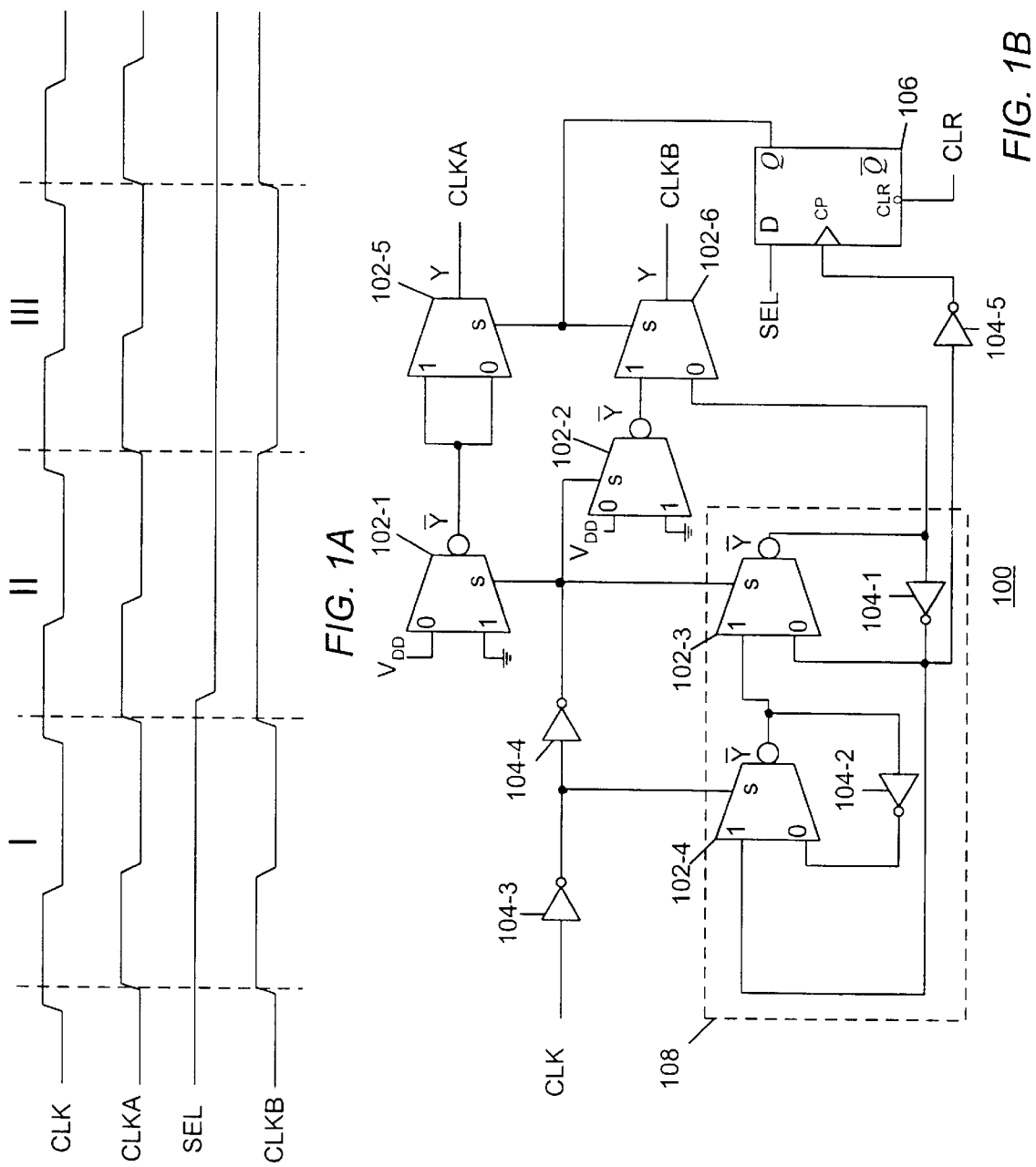
FIG. 1A is a timing diagram illustrating output clocks of one embodiment of a multiplexed synchronization circuit in accordance with the present invention.
FIG. 1B is a circuit diagram illustrating one embodiment of a multiplexed synchronization circuit in accordance with the present invention.

Referring to FIG. 1A, there is shown a timing diagram illustrating output clocks of one embodiment of a multiplexed synchronization circuit in accordance with the present invention. The timing diagram includes a master clock CLK, a slave clock CLKA, a slave clock CLKB, and a select signal SEL. The timing diagram in FIG. 1A also includes clock periods I–III which are delineated by vertical dashed lines.

During clock period I, the select signal SEL is held high (e.g., 5V, 3.3V), and the slave clock CLKA and the slave clock CLKB are non-divided copies of the master clock CLK. During clock periods II and III, the select signal SEL is held low (e.g., 0V), and the slave clock CLKB is a divided copy of the master clock CLK. Specifically, the slave clock CLKB is one half the frequency of the master clock CLK.

It is noted that the present invention, as described below in conjunction with FIG. 1B, enables the edges of the slave clock CLKA and the slave clock CLKB to remain synchronized during the clock periods II and III as illustrated in FIG. 1A.

Referring to FIG. 1B, there is shown a circuit diagram illustrating one embodiment of a multiplexed synchronization circuit 100 (hereinafter also referred to as "sync circuit 100") in accordance with the present invention. This embodiment uses the master clock CLK to provide the slave clocks CLKA and CLKB as described above in conjunction with FIG. 1A.

The sync circuit 100 includes multiplexers 102-1 through 102-6, inverters 104-1 through 104-5, and a flip-flop 106. Multiplexers 102-1 through 102-6 each have three inputs (hereinafter also referred to as inputs "0", "1", and "s") and two outputs (hereinafter also referred to as outputs Y and $\overline{Y}$). Multiplexers 102-1 through 102-4 are implemented using inverting multiplexers having inverted outputs $\overline{Y}$. They are implemented, for example, using standard cell inverting multiplexers and Complementary Metal Oxide Silicon (CMOS) technology. While multiplexers are used in this embodiment, other selection circuits (e.g., combinational logic) can be used to implement the present invention.

Inverters 104-1 through 104-5 each have an input and an output. They are implemented, for example, using standard cell inverters and CMOS technology.

Flip-flop 106 has three inputs (hereinafter also referred to as inputs "D," "CP," and "CLR") and two outputs (hereinafter also referred to as outputs Q and $\overline{Q}$). Flip-flop 106 is, for example, an edge-triggered D-type flip-flop. The flip-flop 106 is implemented, for example, using a standard cell flip-flop and CMOS technology.

Multiplexers 102-1 and 102-2 have their respective "0" inputs coupled to a voltage source $V_{DD}$ (e.g., 5V, 3.3V), and their respective "1" inputs coupled to ground (e.g.,0V). Multiplexers 102-1 and 102-2 have their respective "s" inputs coupled to the master clock CLK. Multiplexers 102-1 and 102-2 generate the synchronized slave clocks CLKA and CLKB, respectively, by toggling between $V_{DD}$ and ground in response to each rising and falling edge of the master clock CLK.

Multiplexers 102-3 and 102-4 are coupled to inverters 104-1 and 104-2, respectively, to provide a divide-by-2 circuit 108. The $\overline{Y}$ output of multiplexer 102-3 is coupled to the "0" input of multiplexer 102-3 through a first feedback path that includes inverter 104-1. The $\overline{Y}$ output of multiplexer 102-3 is also coupled to the "1" input of multiplexer 102-4 through a second feedback path that includes also inverter 104-1. Similarly, the $\overline{Y}$ output of multiplexer 102-4 is coupled to the "0" input of multiplexer 102-4 through a feedback path that includes inverter 104-2. The $\overline{Y}$ output of multiplexer 102-4 is also coupled to the "1" input of multiplexer 102-3. The "s" input of multiplexer 102-3 is coupled to the master clock CLK and the "s" input of multiplexer 102-4 is coupled to an inverted master clock CLK via inverter 104-3. Alternatively, the equivalent of an inverted master clock CLK may be provided to multiplexer 102-4 by swapping the "1" input and the "0" input of multiplexer 102-4.

Multiplexer 102-5 has its "1" input and its "0" input coupled to the $\overline{Y}$ output of multiplexer 102-1. Multiplexer 102-5 is a dummy multiplexer for equalizing the delay between slave clock CLKA and slave clock CLKB. The "s" input of multiplexer 102-5 is coupled to the Q output of flip-flop 106. The "s" input is used for synchronizing slave clocks CLKA and CLKB. The Y output of multiplexer 102-5 provides slave clock CLKA.

Multiplexer 102-6 has its "1" input coupled to the $\overline{Y}$ output of multiplexer 102-2 and its "0" input coupled to the $\overline{Y}$ output of multiplexer 102-3. In response to the select signal SEL, multiplexer 102-6 selects between a non-divided slave clock CLKB generated by multiplexer 102-2 or a divided slave clock CLKB generated by divide-by-2 circuit 108. The "s" input of multiplexer 102-6 is coupled to the Q output of flip-flop 106 for selecting between the divided slave clock CLKB and the non-divided slave clock CLKB. The Y output of multiplexer 102-6 provides slave clock CLKB.

Flip-flop 106 has its "D" input coupled to select signal SEL and its "CP" input coupled to the $\overline{Y}$ output of multiplexer 102-3. The $\overline{Y}$ output of multiplexer 102-3 is inverted by inverters 104-1 and 104-5, respectively, before reaching the "CP" input of flip-flop 106. The CLR input is used to clear the state of flip-flop 106. The $\overline{Q}$ output is not used in this embodiment.

Flip-flop 106 (hereinafter also referred to as "glitch prevention circuit") qualifies the selection between the divided slave clock CLKB and the non-divided slave clock CLKB by removing glitches that appear in select signal SEL.

Having fully described the sync circuit 100 above, the operation of the sync circuit 100 will now be described in detail below.

During clock period I (FIG. 1A), flip-flop 106 provides a "high" select signal SEL to the "s" input of multiplexer 102-6. Multiplexer 102-6 functions as a "gate" allowing the non-divided slave clock CLKB (i.e., generated by multiplexer 102-2) to pass to the output, but not the divided slave clock CLKB. The slave clocks CLKA and CLKB are generated by multiplexers 102-1 and 102-2, respectively, in response to each rising and falling edge of the master clock CLK. As shown in FIGS. 1A and 1B, multiplexer 102-5 equalizes the delay between the slave clocks CLKA and CLKB.

During clock periods II and III, flip-flop 106 provides a "low" select signal SEL to the "s" input of multiplexer 102-6. Again, multiplexer 102-6 functions as a "gate," this time allowing the divided slave clock CLKB (i.e., generated by the divide-by-2 circuit 108) to pass to the output, but not the non-divided slave clock CLKB. As in clock period I, multiplexer 102-5 equalizes the delay between the slave clocks CLKA and CLKB.

The sync circuit 100 described above in conjunction with FIG. 1B provides synchronization between slave clocks generated from a common master clock without resorting to, for example, a second source clock operating at twice the frequency of the master clock. By not using a second source clock (e.g., PLL), chip area consumption is reduced.

The circuit described above in conjunction with FIGS. 1A and 1B is for synchronizing synthesized clocks. The present invention, however, is applicable to other types of signals. For example, a flip-flop is a circuit device that typically generates two output signals, where one output signal is an inverted copy of the other output signal. Delay added to the inverted signal can cause the output signals to be out of sync. A circuit that emulates the flip-flop device but provides synchronized output signals is described below in conjunction with FIG. 2.

Figure 2:
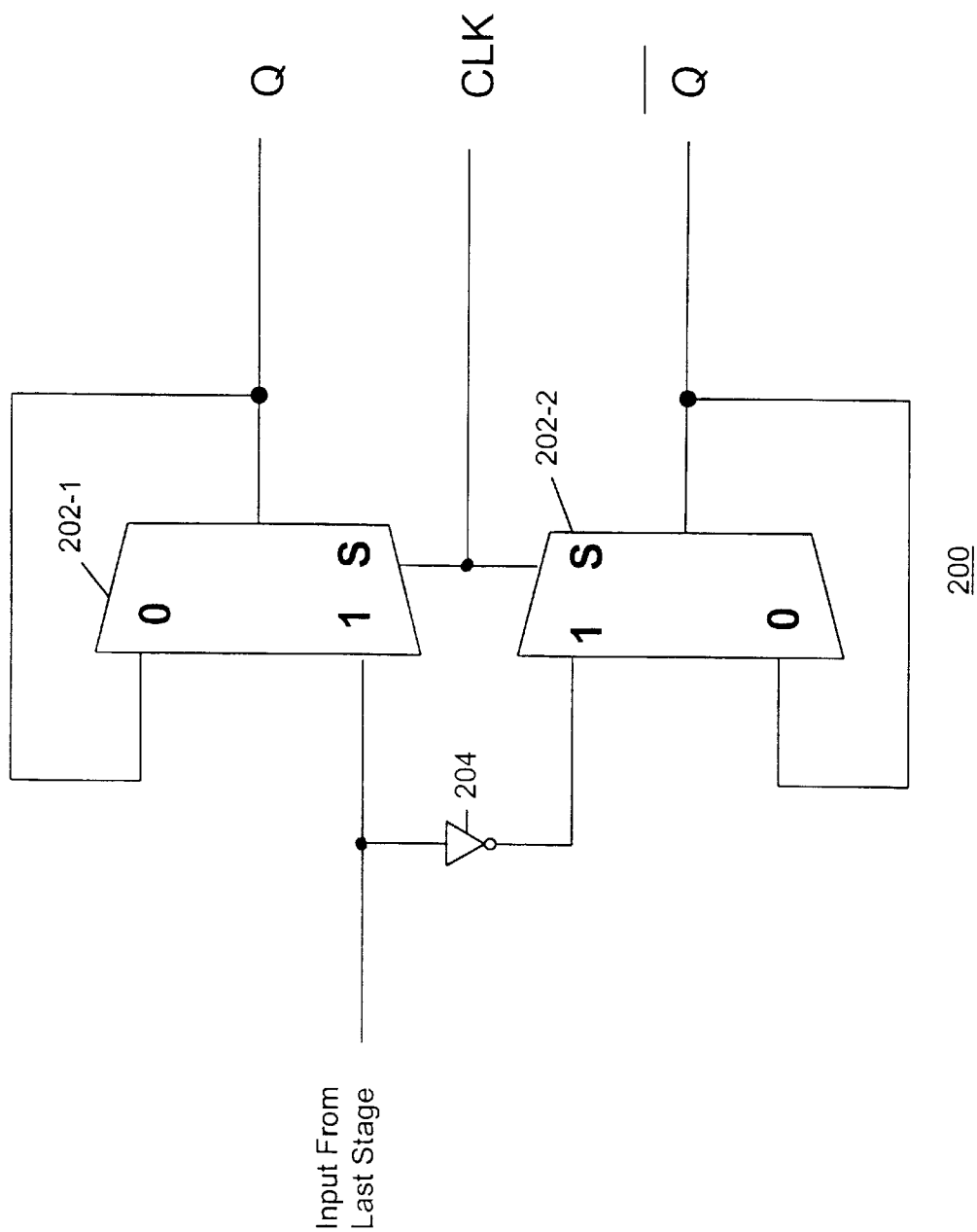
FIG. 2 is a circuit diagram of one embodiment of a synchronous Q and $\overline{Q}$ circuit in accordance with the present invention.

Referring to FIG. 2, there is shown a circuit diagram of one embodiment of a synchronous Q and $\overline{Q}$ circuit 200 in accordance with the present invention (hereinafter also referred to as "Q-sync circuit 200"). The Q-sync circuit 200 includes multiplexers 202-1 and 202-2, and an inverter 204. Multiplexers 202-1 and 202-2 each have three inputs (hereinafter also referred to as "1", "0","s") and two outputs (hereinafter also referred to as Q and $\overline{Q}$). The "1" input of multiplexer 202-1 is coupled to a previous stage (not shown) for receiving an input signal. The "0" input of multiplexer 202-1 is coupled to the Q output of multiplexer 202-1 through a feedback path. The "s" input of multiplexer 202-1 is coupled to clock CLK. Similarly, The "1" input of multiplexer 202-2 is coupled to the previous stage (not shown) via the inverter 204 for receiving an inverted input signal. The "0" input of multiplexer 202-2 is coupled to the $\overline{Q}$ output of multiplexer 202-2 through a feedback path. The "s" input of multiplexer 202-2 is coupled to clock CLK.

The Q-sync circuit 200 described above in conjunction with FIG. 2 provides a synchronous Q and $\overline{Q}$ output. Such a circuit may be used as a building block for more complex circuits such as the circuit described below in conjunction with FIGS. 3A and 3B.

Referring to FIG. 3A, there is shown a timing diagram illustrating output clocks of one embodiment of a quad phase generation circuit 300 (hereinafter referred to as "quad phase circuit 300") in accordance with the present invention. The timing diagram includes a master clock CLK, and four slave clocks CLKA, CLKB, CLKC, and CLKD. The slave clocks CLKA, CLKB, CLKC, and CLKD have respective phases 0°, 90°, 180°, and 270° with the master clock CLK. It is noted that the edges of slave clocks CLKA and CLKC are synchronous and the edges of slave clocks CLKB and CLKD are also synchronous as is illustrated in FIG. 3A. It is further noted that slave clock CLKC is the inverse of slave CLKA and, similarly, slave clock CLKD is the inverse of slave clock CLKB.

Referring to FIG. 3B, there is shown a circuit diagram of one embodiment of the quad phase circuit 300 that provides an output as described in conjunction with FIG. 3A. The quad phase circuit 300 includes multiplexers 302-1 through 302-8 and inverters 304-1 and 304-2. Multiplexers 302-1 and 302-8 each have three inputs (hereinafter also referred to as "1", "0","s") and two outputs (hereinafter also referred to as Y and $\overline{Y}$). Multiplexers 302-1 and 302-4, together with inverter 304-1, comprise a first Q-sync circuit 200 as described above in conjunction with FIG. 2. Similarly, multiplexers 302-5 and 302-8, together with inverter 304-2, comprise a second Q-sync circuit 201 as described above in conjunction with FIG. 2. It is noted that only the Y output of each multiplexer is used in the quad phase circuit. It is further noted from FIG. 3B, that the first Q-sync circuit 200 differs from the second Q-sync circuit 201 in that the "0" inputs of the multiplexers 302-5 and 302-8 are coupled to the previous stage.

Referring to the top half of the quad phase circuit 300, the Y output of multiplexer 302-1 provides the slave clock CLKA. The "1" input of multiplexer 302-1 is coupled to the Y output of multiplexer 302-2. The "0" input of multiplexer 302-1 is coupled to the Y output of multiplexer 302-1 through a feedback path. The "s" input of multiplexer 302-1 is coupled to the master clock CLK. The "0" input of multiplexer 302-2 is coupled to a Y output of multiplexer 302-3. The "1" input of multiplexer 302-2 is coupled to the Y output of multiplexer 302-2 through a feedback path. The "s" input of multiplexer 302-2 is coupled to the master clock CLK. The "1" input of multiplexer 302-3 is coupled to a Y output of multiplexer 302-2. The "0" input of multiplexer 302-3 is coupled to the Y output of multiplexer 302-3 through a feedback path. The "s" input of multiplexer 302-3 is coupled to the master clock CLK. The Y output of multiplexer 302-4 provides the slave clock CLKC. The "1" input of multiplexer 302-4 is coupled to a Y output of multiplexer 302-2. The "0" input of multiplexer 302-4 is coupled to the Y output of multiplexer 302-4 through a feedback path. The "s" input of multiplexer 302-4 is coupled to the master clock CLK. It is noted that multiplexers 302-2 and 302-3, together with inverters 304-1 and 304-2, comprise a divide-by-2 circuit.

Referring to the bottom half of the quad phase circuit 300, the Y output of multiplexer 302-5 provides the slave clock CLKB. The "0" input of multiplexer 302-5 is coupled to the Y output of multiplexer 302-6. The "1" input of multiplexer 302-5 is coupled to the Y output of multiplexer 302-5 through a feedback path. The "s" input of multiplexer 302-5 is coupled to the master clock CLK. The "1" input of multiplexer 302-6 is coupled to an output of multiplexer 302-7. The "0" input of multiplexer 302-6 is coupled to the Y output of multiplexer 302-6 through a feedback path. The "s" input of multiplexer 302-6 is coupled to the master clock CLK. The "0" input of multiplexer 302-7 is coupled to a Y output of multiplexer 302-6 through a feedback path including the inverter 304-2. The "1" input of multiplexer 302-7 is coupled to the Y output of multiplexer 302-7 through a feedback path. The "s" input of multiplexer 302-7 is coupled to the master clock CLK. An output of multiplexer 302-8 provides the slave clock CLKD. The "0" input of multiplexer 302-8 is coupled to a Y output of multiplexer 302-6 through a feedforward path including the inverter 304-2. The "1" input of multiplexer 302-8 is coupled to the Y output of multiplexer 302-8 through a feedback path. The "s" input of multiplexer 302-8 is coupled to the master clock CLK. It is noted that multiplexers 302-6 and 302-7, together with inverters 304-1 and 304-2, comprise a divide-by-2 circuit.

The quad phase circuit 300 generates slave clocks CLKA, CLKB, CLKC, and CLKD having respective phases 0°, 90°, 180°, and 270° with the master clock CLK. It is noted that the edges of slave clocks CLKA and CLKC are synchronous and the edges of slave clocks CLKB and CLKD are also synchronous as is illustrated in FIG. 3A.

The quad phase circuit 300 provides synchronization between slave clocks generated from a common master clock without resorting to, for example, a second source clock operating at twice the frequency of the master clock. By not using a second source clock (e.g., PLL), chip area consumption is reduced.

Although the present invention has been described in considerable detail with reference to certain preferred embodiments thereof, other embodiments are possible. For example, the embodiment as described above can be extended to applications involving frequency synthesis in general, where divisions other than two can be accommodated, and to other synchronization problems. While the multiplexer architecture used in the embodiment described above is easily tuned for certain applications, other multiplexer architectures may also be used with the present invention.

Therefore, the spirit and scope of the appended claims should not be limited to the description of the preferred embodiments herein.

What is claimed is:

1. A synchronization circuit coupled to a source signal, comprising:

a first selection circuit coupled to the source signal for providing a first slave signal, the first slave signal being a copy of the source signal;

a second selection circuit coupled to the source signal for providing a second slave signal, the second slave signal being a synchronized copy of the first slave signal;

a divide-by-n circuit coupled to the source signal for providing a third slave signal, the third slave signal being a synchronized, divided copy of the second slave signal;

a third selection circuit coupled to the second selection circuit and the divide-by-n circuit for selecting between the second slave signal and the third slave signal in response to a select signal; and a fourth selection circuit coupled to an output of the first selection circuit and to the select signal for providing a matching delay to synchronize the first slave signal, the second slave signal, and the third slave signal.

2. The circuit of claim 1, further including a glitch prevention circuit for providing a select signal to the third selection circuit and the fourth selection circuit.

3. The circuit of claim 1, wherein the first selection circuit and the second selection circuit are multiplexers having a plurality of inputs and outputs, at least one input of each multiplexer being coupled to the source signal.

4. The circuit of claim 1, wherein the fourth selection circuit is a multiplexer.

5. The circuit of claim 1, wherein the first and the second selection circuit each have one input coupled to a voltage source and one input coupled to ground.

6. The circuit of claim 2, wherein the glitch prevention circuit includes a D-type flip-flop having an input coupled to an output of the divide-by-n circuit for receiving the third slave signal.

7. A method of synchronizing signals, comprising the steps of:

generating a first slave signal and a second slave signal from a source signal, the first slave signal and the second slave signal being synchronized;

generating a third slave signal from the source signal that is a synchronized, divided copy of the second slave signal;

switching between the second slave signal and the third slave signal in response to a select signal; and delaying the first slave signal to synchronize the first slave signal with the second slave signal and the third slave signal.

8. The circuit of claim 1, wherein the divide-by-n circuit is configured as a divide-by-2 circuit and includes:

a fifth selection circuit having a plurality of inputs and an output, at least one input coupled to the source signal, at least one input coupled to the output of the fifth selection circuit through a feedback path including a first inverter, the output of the fifth selection circuit coupled to an input of the third selection circuit; and a sixth selection circuit having a plurality of inputs and an output, at least one input coupled to an inverted source signal, at least one input coupled to the output of the sixth selection circuit through a feedback path including a second inverter, at least one input coupled to an output of the fifth selection circuit through a feedback path including the first inverter, the output of the sixth selection circuit coupled to an input of the fifth selection circuit.

9. A synchronization circuit coupled to a master clock, comprising:

a first multiplexer coupled to the master clock for providing a first slave clock, the first slave clock being a copy of the master clock;

a second multiplexer coupled to the master clock for generating a second slave clock, the second slave clock being a synchronized copy of the first slave clock;

a divide-by-n circuit coupled to the master clock for generating a third slave clock, the third slave clock being a synchronized, divided copy of the second slave clock;

a third multiplexer coupled to the second multiplexer and the divide-by-n circuit for selecting between the second slave clock and the third slave clock in response to a select signal; and a fourth multiplexer circuit coupled to an output of the first multiplexer and to the select signal for providing a matching delay to synchronize the first slave clock, the second slave clock, and the third slave clock.

10. The circuit of claim 9, wherein the divide-by-n circuit is configured as a divide-by-2 circuit and includes:

a fifth multiplexer having a plurality of inputs and an output, at least one input coupled to the master clock, at least one input coupled to the output of the fifth multiplexer through a feedback path including a first inverter, the output of the fifth selection circuit coupled to an input of the third selection circuit; and a sixth selection circuit having a plurality of inputs and an output, at least one input coupled to an inverted master clock, at least one input coupled to the output of the sixth selection circuit through a feedback path including a second inverter, at least one input coupled to an output of the fifth selection circuit through a feedback path including the first inverter, the output of the sixth selection circuit coupled to an input of the fifth selection circuit.

11. The circuit of claim 9, wherein the first and the second multiplexer each have one input coupled to a voltage source and one input coupled to ground.

12. A synchronization circuit coupled to a source signal, comprising:

a means for generating a first slave signal and a second slave signal from the source signal, the first slave signal and the second slave signal being synchronized;

a means for generating a third slave signal from the source signal that is a synchronized, divided copy of the second slave signal;

a means for switching between the second slave signal and the third slave signal in response to a select signal; and a means for delaying the first slave signal to synchronize the first slave signal with the second slave signal and the third slave signal.

* * * * *